(12) United States Patent
Nakagawa et al.

(10) Patent No.: US 8,933,475 B2
(45) Date of Patent: Jan. 13, 2015

(54) LIGHT EMITTING DEVICE

(75) Inventors: Katsutoshi Nakagawa, Yokohama (JP);
Yasumasa Ooya, Chigasaki (JP);
Yoshitaka Funayama, Yokohama (JP);
Daichi Usui, Yokohama (JP)

(73) Assignees: Kabushiki Kaisha Toshiba, Tokyo (JP);
Toshiba Materials Co., Ltd.,
Yokohama-shi (JP)

( * ) Notice: Subject to any disclaimer, the term of this patent is extended or adjusted under 35 U.S.C. 154(b) by 0 days.

(21) Appl. No.: 13/609,726

(22) Filed: Sep. 11, 2012

(65) Prior Publication Data

US 2013/0240915 A1 Sep. 19, 2013

Related U.S. Application Data

(63) Continuation of application No. PCT/JP2011/001178, filed on Mar. 1, 2011.

(30) Foreign Application Priority Data

Mar. 11, 2010 (JP) ................................. 2010-054418

(51) Int. Cl.
*H01L 33/50* (2010.01)
*H01L 33/56* (2010.01)
(Continued)

(52) U.S. Cl.
CPC .......... *H01L 33/501* (2013.01); *H01S 5/02296* (2013.01); *H01L 33/02* (2013.01);
(Continued)

(58) Field of Classification Search
CPC .... H01L 33/501; H01L 33/502; H01L 33/504

USPC ....................................................... 257/88, 98
See application file for complete search history.

(56) References Cited

U.S. PATENT DOCUMENTS 6,762,148 B2 * 7/2004 Ohishi et al. .................. 502/318
2005/0173708 A1 8/2005 Suechiro et al.
(Continued)

FOREIGN PATENT DOCUMENTS

JP 4-357176 12/1992
JP 2005-252219 A 9/2005
(Continued)

OTHER PUBLICATIONS

International Search Report issued Jun. 7, 2011 in PCT/JP2011/001178 filed Mar. 1, 2011 (with English Translation).
(Continued)

*Primary Examiner* — Olik Chaudhuri
*Assistant Examiner* — Christine Enad
(74) *Attorney, Agent, or Firm* — Oblon, Spivak, McClelland, Maier & Neustadt, L.L.P.

(57) ABSTRACT

A light emitting device 1 according to an embodiment includes a planar alumina substrate, a semiconductor light-emitting element mounted on the alumina substrate, and a phosphor layer. The phosphor layer includes a silicone resin layer provided to cover an upper surface and a side surface of the semiconductor light-emitting element and a phosphor emitting visible light by being excited with light emitted from the semiconductor light-emitting element. The phosphor is dispersed in the silicone resin layer. The alumina substrate has a water absorption rate of 5% or more and 60% or less, and an adhesion strength between the alumina substrate and the silicone resin layer is 1 N or more.

10 Claims, 2 Drawing Sheets

(51) Int. Cl.
*H01S 5/022* (2006.01)
*H01L 33/02* (2010.01)
*H01S 5/00* (2006.01)

(52) U.S. Cl.
CPC ............ *H01L 33/504* (2013.01); *H01L 33/505* (2013.01); *H01S 5/005* (2013.01); *H01S 5/02228* (2013.01); *H01L 33/56* (2013.01)
USPC .................. 257/98; 438/27; 438/29; 438/35; 257/100

(56) References Cited

U.S. PATENT DOCUMENTS

| | | |
|---|---|---|
| 2008/0112165 A1 | 5/2008 | Mori et al. |
| 2008/0221264 A1* | 9/2008 | Weidinger .................... 524/588 |
| 2009/0090926 A1* | 4/2009 | Wang et al. ..................... 257/99 |
| 2009/0278151 A1* | 11/2009 | Kim ................................ 257/98 |
| 2010/0123151 A1* | 5/2010 | Hata et al. ........................ 257/98 |
| 2010/0237361 A1 | 9/2010 | Sakai et al. |

FOREIGN PATENT DOCUMENTS

| | | |
|---|---|---|
| JP | 2008-147610 A | 6/2008 |
| JP | 2009-164157 | 7/2009 |
| JP | 2010-40861 | 2/2010 |
| WO | WO 2009/037848 A1 | 3/2009 |
| WO | WO 2009/145298 A1 | 12/2009 |

OTHER PUBLICATIONS

Written Opinion issued Jun. 7, 2011 in PCT/JP2011/001178 filed Mar. 1, 2011.
Office Action mailed Oct. 28, 2014, in Japanese Patent Application No. 2012-504308.

* cited by examiner

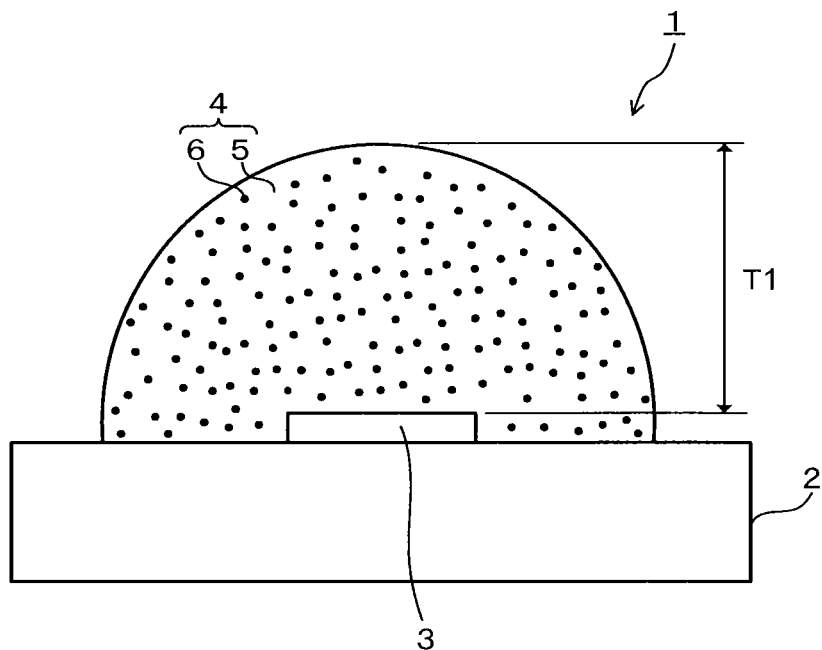
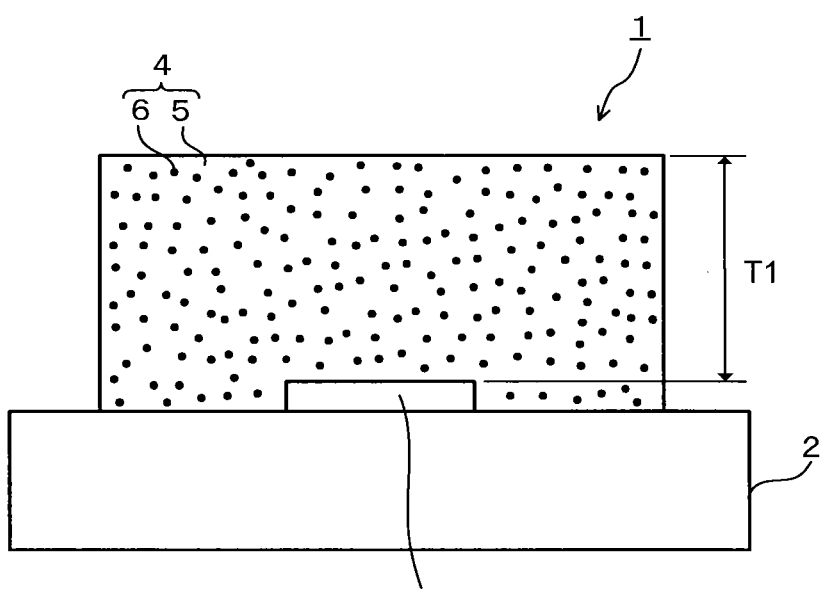

LIGHT EMITTING DEVICE

CROSS-REFERENCE TO RELATED APPLICATIONS

This application is a continuation of prior International Application No. PCT/JP2011/001178 filed on Mar. 1, 2011, which is based upon and claims the benefit of priority from Japanese Patent Application No. 2010-054418 filed on Mar. 11, 2010; the entire contents of all of which are incorporated herein by reference.

FIELD

Embodiments described herein relate generally to a light emitting device.

BACKGROUND

A light emitting device using a light-emitting diode (LED) is widely used for lighting devices such as a backlight for a liquid crystal display device, a signal device, a switch, a lamp for vehicle, and a general lighting. In particular, a white light emitting LED lamp (white LED lamp) in which the LED and a phosphor are combined is focused as an alternate of a lighting fixture using an incandescent lamp and a fluorescent lamp in addition to the backlight of the liquid crystal display device, the lamp for vehicle and so on, and it is translated into practical applications as a white lighting fixture.

An LED lamp in which a blue light emitting LED chip and a yellow phosphor (YAG and so on) are combined and an LED lamp in which a near-ultraviolet light emitting LED chip of which light emitting wavelength is approximately 360 nm to 440 nm and a mixture of respective phosphors of blue, green, red (BGR phosphor) are combined are known as the white LED lamp. In the latter white LED lamp, a phosphor layer is formed by dispersing the phosphor in a transparent resin sealing the LED chip, and a visible light with a desired color such as a white light is obtained by converting near-ultraviolet light emitted from the LED chip into a longer-wavelength light by the phosphor.

The white LED lamp using the latter near-ultraviolet light emitting LED chip is excellent in color reproducibility and a color rendering property compared to the former one, but there is a weakness in inferior to light emission efficiency. There are some reasons in which the LED lamp as stated above becomes disadvantageous in the light emission efficiency, and a film thickness of the phosphor layer is thick can be cited as one of the reasons. The near-ultraviolet light emitted from the LED chip has energy stronger than the visible light, and there is a possibility in which peripheral parts such as a resin constituting the LED lamp are deteriorated. Besides, there is a possibility in which a human body and so on suffers adverse effect if the near-ultraviolet light leaks out of the LED lamp. Accordingly, the thickness of the phosphor layer made up of the transparent resin and the phosphor is made enough thick so that the phosphor absorbs the near-ultraviolet light emitted from the LED chip as much as possible.

A structure in which a substrate and a reflector are combined prevails in the LED lamp, but a probability becomes high in which the visible light emitted from the phosphor is returned to the phosphor layer reflected by the reflector if the reflector exists near the phosphor layer. The visible light returned to the phosphor layer is lost by multiple light reflection of phosphor particles with each other, and therefore, it is a disadvantageous structure from a point of view of the light emission efficiency. Application of a lamp structure in which the reflector is not provided to reduce the loss caused by the multiple light reflection has been studied. According to an LED lamp in which only the LED chip and the phosphor layer covering the LED chip are disposed on the substrate, it is possible to draw the light from not only an upper part but also a side surface of the phosphor layer, and therefore, the light emission efficiency is able to be increased. In the LED lamp excluding the reflector, it is desired to improve adhesion strength between the transparent resin constituting the phosphor layer and the substrate.

BRIEF DESCRIPTION OF THE DRAWINGS

FIG. 1 is a sectional view illustrating a light emitting device according to an embodiment.

FIG. 2 is a sectional view illustrating a modification example of the light emitting device illustrated in FIG. 1.

DETAILED DESCRIPTION

Figure 3:
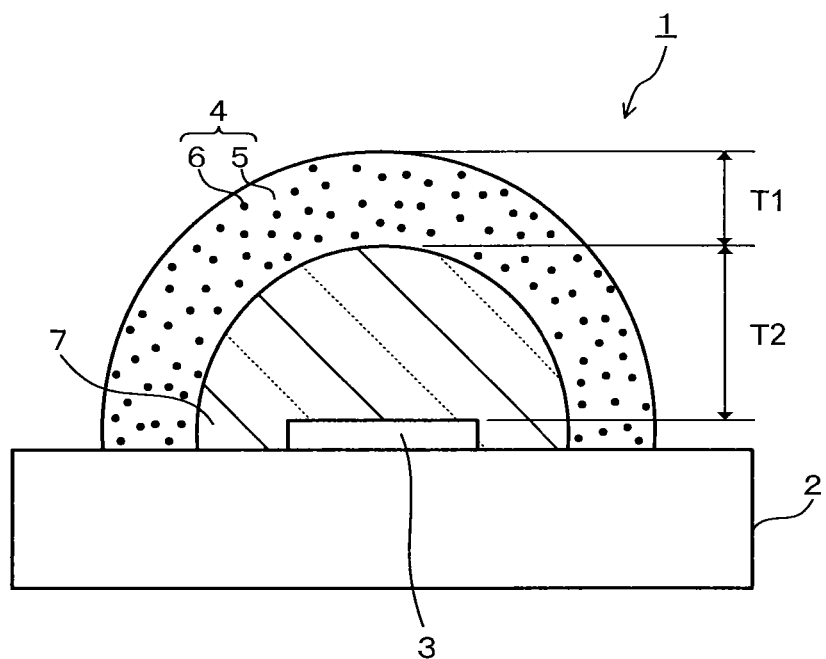
FIG. 3 is a sectional view illustrating another modification example of the light emitting device illustrated in FIG. 1.

In one embodiment, a light emitting device includes: a planar alumina substrate; a semiconductor light-emitting element mounted on the alumina substrate; and a phosphor layer converting light emitted from the semiconductor light-emitting element into visible light. The phosphor layer includes a silicone resin layer provided to cover an upper surface and a side surface of the semiconductor light-emitting element and a phosphor dispersed in the silicone resin layer and emitting visible light by being excited with light emitted from the semiconductor light-emitting element. The alumina substrate has a water absorption rate of 5% or more and 60% or less. An adhesion strength between the alumina substrate and the silicone resin layer is 1 N or more.

Hereinafter, a light emitting device according to an embodiment is described with reference to the drawings. FIG. 1 is a sectional view illustrating a configuration of the light emitting device according to the embodiment. A light emitting device 1 illustrated in FIG. 1 includes a planar alumina substrate 2, a semiconductor light-emitting element 3 mounted on the alumina substrate 2, and a phosphor layer 4 converting light emitted from the semiconductor light-emitting element 3 into visible light and emitting the light.

An LED chip, a laser diode (LD) chip, and so on are used as the semiconductor light-emitting element 3. An ultraviolet light emitting LED chip, a violet light emitting LED chip, a blue-violet light emitting LED chip, a blue light emitting LED chip, an LD chip having a similar emission color, and so on can be cited as concrete examples of the semiconductor light-emitting element 3. A light-emitting diode such as an InGaN base, a GaN base, an AlGaN base is used for the LED chip. A wiring network (not-illustrated) is provided at a surface (further, inside thereof according to need) of the alumina substrate 2, and a wiring substrate is made up by the wiring network. Not-illustrated first and second electrodes are provided at the surface of the alumina substrate 2.

The semiconductor light-emitting element 3 is mounted on the alumina substrate 2 such that, for example, a lower electrode thereof is electrically connected to the first electrode. An upper electrode of the semiconductor light-emitting element 3 is electrically connected to the second electrode (not-illustrated) of the alumina substrate 2 via bonding wires (not-illustrated). The electrodes of the semiconductor light-emitting element 3 may be each electrically connected to the first and second electrodes of the alumina substrate 2 via the bonding wires. A direct-current voltage is applied to the semiconductor light-emitting element 3 by an electrical connection structure as stated above. The semiconductor light-emitting elements 3 may be mounted on the alumina substrate 2 in plural.

The semiconductor light-emitting element 3 mounted on the alumina substrate 2 is covered with the phosphor layer 4. The phosphor layer 4 includes a silicone resin layer 5 provided to cover an upper surface and a side surface of the semiconductor light-emitting element 3, and a phosphor 6 dispersed in the silicone resin layer 5. The phosphor layer 4 has the phosphor 6 emitting desired visible light by being excited with the light emitted from the semiconductor light-emitting element 3. Electric energy applied to the light emitting device 1 is converted into the light with a desired wavelength at the semiconductor light-emitting element 3, and further, converted into the light with a longer wavelength at the phosphor 6 to be emitted outside.

When the light emitted from the semiconductor light-emitting element 3 is the visible light such as the blue light, visible light in a desired color (for example, white light) is obtained as a total because the light emission from the semiconductor light-emitting element 3 and the light emission from the phosphor 6 are mixed to be emitted. When the light emitted from the semiconductor light-emitting element 3 is light with short-wavelength such as the ultraviolet light and the violet light, the light emitted from the phosphor 6 constituted by plural kinds of phosphor particles is mixed to be emitted, and thereby, visible light in a desired color (for example, white light) is obtained as a total. The reflector and so on is not provided at the surface of the alumina substrate 2, and only the semiconductor light-emitting element 3 and the phosphor layer 4 are disposed. Accordingly, the desired visible light is drawn from a whole surface of the phosphor layer 4 in the light emitting device 1 according to the embodiment.

A shape of the phosphor layer 4 is not particularly limited as long as the visible light is able to be drawn from the whole surface thereof. FIG. 1 illustrates a semispherical phosphor layer 4 (the silicone resin layer 5 in which the phosphor 6 is dispersed). The shape of the phosphor layer 4 may be a columnar shape or an oval cylindrical shape as illustrated in FIG. 2. Further, a planar shape of the phosphor layer 4 may be a quadrangle or a polygon, but it is preferable to be spherical or elliptical (semispherical, columnar state, oval cylindrical state, and so on as a whole shape) from a point of view of uniformly dispersing the visible light emitted from the light emitting device 1.

A thickness of the phosphor layer 4 (a thickness T1 on an upper surface of the semiconductor light-emitting element 3) is preferable to be within a range of 0.1 mm to 2 mm. When the thickness T1 of the phosphor layer 4 is less than 0.1 mm, the ultraviolet light and so on is easy to transmit through the phosphor layer. On the other hand, when the thickness T1 of the phosphor layer 4 exceeds 2 mm, the light emission of the phosphor 6 is multiply scattered in the phosphor layer 4 and the light emission efficiency is easy to be lowered.

An emission color of the light emitting device 1 is determined by a combination of a light emission wavelength of the semiconductor light-emitting element 3 and the phosphor 6. A light emission peak wavelength of the semiconductor light-emitting element 3 is not particularly limited. It is possible to use the semiconductor light-emitting elements 3 having various kinds of light emission wavelengths from the ultraviolet light to the blue light to obtain the light in each color such as a white light by combining with the phosphor layer 4. The light emission peak wavelength of the semiconductor light-emitting element 3 is preferable to be within a range of 350 nm to 480 nm. In particular, it is preferable to use the ultraviolet to violet light emitting semiconductor light-emitting element (hereinafter, it is named generically as a ultraviolet light emitting semiconductor light-emitting element) 3 of which light emission peak wavelength is within a range of 360 nm to 440 nm. Further, it is more preferable to use the semiconductor light-emitting element 3 of which light emission peak wavelength is within a range of 360 nm to 410 nm.

The phosphor layer 4 includes the phosphor 6 to obtain the desired emission color. It is possible to use the phosphors of respective colors such as a blue phosphor, a green phosphor, a red phosphor to obtain an aimed emission color. For example, a combination of the blue light emitting semiconductor light-emitting element 3 and the yellow phosphor (YAG, and so on), or a combination of the ultraviolet light emitting semiconductor light-emitting element 3 and the mixed phosphor of the blue phosphor, the green phosphor, and the red phosphor (BGR phosphor) is applied to enable the white light emitting light emitting device 1. This embodiment is preferable to be applied to the white light emitting light emitting device 1, and in particular, it is suitable for the light emitting device 1 in which the ultraviolet light emitting semiconductor light-emitting element 3 and the BGR phosphor are combined.

In the light emitting device 1 in which the ultraviolet light emitting semiconductor light-emitting element 3 and the BGR phosphor are combined, the phosphor 6 is constituted by a mixed phosphor of the blue (B) phosphor emitting the blue light, the green (G) phosphor emitting the green light, and the red (R) phosphor emitting the red light, by absorbing the light (for example, the ultraviolet light and the violet light) emitted from the semiconductor light-emitting element 3. The BGR phosphor may include two or more kinds of phosphors in the same color, or may subsidiary include a phosphor having an emission color other than the blue, green, red (for example, a yellow phosphor, an orange phosphor, a deep red phosphor, and so on). The yellow (Y) phosphor may be used instead of the green phosphor. It is preferable to use the BGR or BYR phosphor as the phosphor 6. The mixture phosphor such as the BGR or BYR phosphor may be dispersed in the silicone resin layer 5 under a state in which each phosphor is bonded in advance with a binder.

Examples of respective phosphors constituting the BGR phosphor are represented below, but the phosphor 6 constituting the phosphor layer 4 is not limited the phosphors described below. A phosphor of which light emission peak wavelength is within a range of 430 nm to 460 nm is used as the blue phosphor, and for example, a europium activated chlorophosphate phosphor having a composition represented by a formula (1) can be cited.

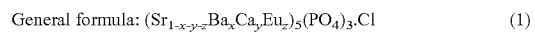

General formula: $(Sr_{1-x-y-z}Ba_xCa_yEu_z)_5(PO_4)_3Cl$ (1)

(In the formula, x, y, and z are numerals satisfying $0 \leq x < 0.5$, $0 \leq y < 0.1$, $0.005 < z < 0.1$)

A phosphor of which light emission peak wavelength is within a range of 490 nm to 575 nm is used as the green phosphor, and for example, a europium and manganese activated aluminate phosphor having a composition represented by a formula (2) and a europium and manganese activated silicate phosphor having a composition represented by a formula (3) can be cited.

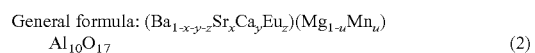

General formula: $(Ba_{1-x-y-z}Sr_xCa_yEu_z)(Mg_{1-u}Mn_u)Al_{10}O_{17}$ (2)

(In the formula, x, y, z and u are numerals satisfying $0 \leq x < 0.2$, $0 \leq y < 0.1$, $0.005 < z < 0.5$, $0.1 < u < 0.5$)

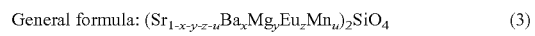

General formula: $(Sr_{1-x-y-z-u}Ba_xMg_yEu_zMn_u)_2SiO_4$ (3)

(In the formula, x, y, z and u are numerals satisfying $0.1 \leq x \leq 0.35$, $0.025 \leq y \leq 0.105$, $0.025 \leq z \leq 0.25$, $0.0005 \leq u \leq 0.02$)

A phosphor of which light emission peak wavelength is within a range of 620 nm to 780 nm is used as the red phosphor, and for example, a europium activated oxysulfide phosphor having a composition represented by a formula (4) and a europium activated nitride phosphor having a composition represented by a formula (5) can be cited.

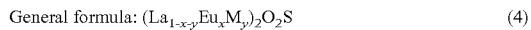

General formula: $(La_{1-x-y}Eu_xM_y)_2O_2S$     (4)

(In the formula, M represents at least one kind of element selected from Sb, Sm, Ga and Sn, and x and y are numerals satisfying $0.01 < x < 0.15$, $0 \leq y < 0.03$)

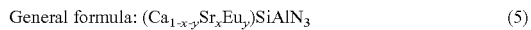

General formula: $(Ca_{1-x-y}Sr_xEu_y)SiAlN_3$     (5)

(In the formula, x and y are numerals satisfying $0 \leq x < 0.4$, $0 < y < 0.5$)

A transparent silicone resin layer 7 which does not contain the phosphor may be interposed between the semiconductor light-emitting element 3 and the phosphor layer 4 as illustrated in FIG. 3. In this case, the semiconductor light-emitting element 3 is covered with the transparent silicone resin layer 7. The phosphor layer 4 is disposed on the transparent silicone resin layer 7. The transparent silicone resin layer 7 is interposed between the semiconductor light-emitting element 3 and the phosphor layer 4, and thereby, the light emission efficiency of the semiconductor light-emitting element 3 improves. Namely, when the transparent silicone resin layer 7 is interposed, a probability in which the light emitted from the semiconductor light-emitting element 3 is absorbed by the semiconductor light-emitting element 3 and lost becomes small even if the light is reflected by the phosphor layer 4. Accordingly, a utilization efficiency of the light, in other words, the light emission efficiency of the light emitting device 1 can be increased.

A thickness of the transparent silicone resin layer 7 (a thickness T2 on the upper surface of the semiconductor light-emitting element 3) is preferable to be within a range of, for example, 0.5 mm to 5 mm. When the thickness T2 of the transparent silicone resin layer 7 is less than 0.5 mm, there is a possibility in which a disposition effect thereof cannot be enough obtained. When the thickness T2 of the transparent silicone resin layer 7 exceeds 5 mm, there is a possibility in which the absorption of the light occurs. It is preferable that the thickness T2 of the transparent silicone resin layer 7 is set to be 5 mm or less even if a size of the light emitting device 1 in itself is considered. The thickness T1 of the phosphor layer 4 at this time is preferable to be within a range of 0.1 mm to 2 mm on the upper surface of the semiconductor light-emitting element 3 as stated above.

Incidentally, in the light emitting device 1 in which the ultraviolet light emitting semiconductor light-emitting element 3 and the BGR phosphor are combined, the thickness T1 of the phosphor layer 4 is made thick such as, for example, 0.1 mm to 2 mm to suppress that the ultraviolet light leaks out. This becomes a factor deteriorating the light emission efficiency of the light emitting device 1. Further, in the phosphor layer 4 containing the BGR phosphor, a dispersion amount of the phosphor particles increases compared to a case when a single color phosphor is used, and the phosphor particles in themselves become a factor scattering the light, and therefore, drawing efficiency of the light (light emission efficiency) of the light emitting device 1 is easy to be lowered.

In the light emitting device 1 in which the ultraviolet light emitting semiconductor light-emitting element 3 and the BGR phosphor are combined, a device structure (a structure in which the reflector is excluded) as illustrated in FIG. 1 and FIG. 2 is advantageous as for the point as stated above from a point of view of the light emission efficiency. The phosphor layer 4 is preferable to be constituted by the silicone resin layer 5 which is excellent in a deterioration resistance for the ultraviolet light and the heat. Note that the silicone resin layer 5 is excellent in the deterioration resistance for the ultraviolet light and the heat, but has a weakness in which adhesiveness with the alumina substrate 2 is low. When the silicone resin layer 5 is peeled off, non-lighting failure caused by wire breakage and so on is incurred. This becomes a factor deteriorating handleability of the light emitting device 1.

In the light emitting device 1 according to the embodiment, the alumina substrate 2 of which water absorption rate is 5% to 60% is used. The alumina substrate 2 having a proper water absorption rate is used, and thereby, an adhesion strength of the silicone resin layer 5 improves. Specifically, it becomes possible to set the adhesion strength between the alumina substrate 2 and the silicone resin layer 5 at 1 N (100 gf) or more. The water absorption rate of the alumina substrate 2 represents a value measured by a water absorption rate evaluation method disclosed in EMAS-9101. The adhesion strength between the alumina substrate 2 and the silicone resin layer 5 represents a pressing force when the silicone resin layer 5 (phosphor layer 4) is pressed by a tension gauge from a side surface thereof, and the silicone resin layer 5 (phosphor layer 4) is thereby peeled off.

According to the alumina substrate 2 of which the water absorption rate is 5% or more, the silicone resin is properly immersed, and therefore, it is possible to increase the adhesion strength of the silicone resin layer 5. When the water absorption rate of the alumina substrate 2 is less than 5%, the immersion of the silicone resin is weak, and enough adhesion strength cannot be obtained. Note that when the water absorption rate of the alumina substrate 2 exceeds 60%, the silicone resin is too much immersed, and it becomes difficult to form the silicone resin layer 5 (phosphor layer 4) in a predetermined shape. The water absorption rate of the alumina substrate 2 is more preferable to be within a range of 20% to 50%.

The water absorption rate of the alumina substrate 2 is able to be adjusted by, for example, changing a burning temperature at a substrate burning time. Specifically, the temperature at the substrate burning time is appropriately adjusted within a range of 1100° C. to 1500° C. in accordance with a formation material and so on of the alumina substrate 2, and thereby, the alumina substrate 2 having the proper water absorption rate (the range of 5% to 60%) can be obtained.

The alumina substrate 2 as stated above is used, and thereby, it is possible to make the adhesion strength between the alumina substrate 2 of the light emitting device 1 and the silicone resin layer 5 at 1 N or more. It is the same when the transparent silicone resin layer 7 is interposed between the semiconductor light-emitting element 3 and the phosphor layer 4, and it is possible to make the adhesion strength between the alumina substrate 2 and the transparent silicone resin layer 7 at 1 N or more. As stated above, the adhesion strength between the alumina substrate 2 and the silicone resin layer 5 or the transparent silicone resin layer 7 is set at 1 N or more, and thereby, the handleability of the light emitting device 1 improves. Namely, the peelings of the silicone resin layers 5, 7 at the handling time are suppressed. Accordingly, it is possible to suppress the non-lighting and a device breakage caused by the peeling of the silicone resin layers 5, 7 with good reproducibility.

Further, the light emitting device 1 has a good light emission efficiency based on the structure thereof (the structure in which only the semiconductor light-emitting element 3 and the phosphor layer 4 are disposed on the alumina substrate 2).

Accordingly, it becomes possible to provide the light emitting device 1 excellent in the reliability and the light emission efficiency. The constitution of this embodiment is suitable for the light emitting device 1 in which the semiconductor light-emitting element 3 of which light emission peak wavelength is within the range of 360 nm to 440 nm and the BGR or BYR phosphor are combined. The reason is as stated above. Note that it is not limited to the light emitting device 1 as stated above. The constitution of this embodiment is able to be applied to various kinds of light emitting devices 1 using the alumina substrate 2 and the silicone resin layer 5, and the reliability of the light emitting device 1 is able to be increase also in such a case.

The light emitting device 1 according to the embodiment is manufactured as, for example, described below. At first, a phosphor slurry containing phosphor powder is prepared. The phosphor slurry is prepared by, for example, mixing the phosphor powder with a liquid state silicone resin. A mixture rate of the phosphor and the silicone resin is appropriately selected depending on a kind and a particle size of the phosphor. For example, when the phosphor is 100 parts by mass, an amount of the silicone resin is preferable to be within a range of 5 parts by mass to 100 parts by mass. The kind and mixture rate of the phosphor are arbitrary set in accordance with the aimed emission color.

Next, the phosphor slurry is coated on the semiconductor light-emitting element 3, and the phosphor layer 4 is formed by curing the silicone resin within the phosphor slurry. When the transparent silicone resin layer 7 is applied, at first, the liquid-state silicone resin is coated on the semiconductor light-emitting element 3, and it is cured to form the transparent silicone resin layer 7. The phosphor slurry is coated thereon, and the phosphor layer 4 is formed by curing the silicone resin within the phosphor slurry. The light emitting device 1 is manufactured as stated above. As a coating method of the liquid state silicone resin and the phosphor slurry, a coating method using a dispenser, a printing method, an injection molding method, or the like can be used.

Next, examples and evaluation results thereof are described.

Example 1

The Eu activated chlorophosphate $((Sr_{0.59}Ba_{0.39}Ca_{0.01}Eu_{0.01})_5(PO_4)_3 \cdot Cl)$ phosphor of which average particle size is 12 μM is prepared as the blue phosphor. The Eu and Mn activated silicate $((Sr_{0.7}Ba_{0.15}Mg_{0.0975}Eu_{0.05}Mn_{0.0025})_2SiO_4)$ phosphor of which average particle size is 15 μm is prepared as the green phosphor. The Eu activated lanthanum oxysulfide $(La_{0.938}Eu_{0.06}Sm_{0.002})_2O_2S)$ phosphor of which average particle size is 12 μm is prepared as the red phosphor. These phosphors are each mixed with the silicone resin at a rate of 60 mass % to prepare the phosphor slurries. These phosphor slurries are mixed at a rate of the blue phosphor slurry for 52 mass %, the green phosphor slurry for 3 mass %, and the red phosphor slurry for 45 mass % such that an emission color temperature becomes within a range of 4200 K to 4300 K.

Next, an alumina substrate (shape: 8 mm×3 mm×0.38 mm) of which the water absorption rate is 5.5% is prepared. The water absorption rate of this alumina substrate is adjusted to be 5.5% by setting the temperature at the substrate burning time to be 1480° C. A die pad and a wiring pattern are formed at a surface of the alumina substrate by using Ag paste, and thereafter, three pieces of LED chips of which light emission peak wavelengths are each 405 nm are mounted thereon. The three LED chips are connected in series. The phosphor slurry as stated above is coated on these LED chips in oval cylindrical shape as illustrated in FIG. 2, and the silicone resin is cured by performing a heat treatment at a temperature of 140° C., and thereby, a phosphor layer of which major axis is 6.4 mm, minor axis is 2.5 mm, and thickness T1 is 2 mm is formed. The light emitting device obtained as stated above is provided for a property evaluation as described below.

Examples 2 to 3

The phosphor layers are each formed as same as the example 1 except that an alumina substrate of which the water absorption rate is 11% (example 2) and an alumina substrate of which the water absorption rate is 52% (example 3) are used. The light emitting devices obtained as stated above are provided for the property evaluation as described below.

Example 4

An alumina substrate (shape: 8 mm×6.5 mm×0.38 mm) of which the water absorption rate is 11% is prepared. The die pad and the wiring pattern are formed at a surface of the alumina substrate by using Ag paste, and thereafter, six pieces of LED chips of which light emission peak wavelengths are each 405 nm are mounted. The six pieces of LED chips are connected in series. The phosphor slurries prepared at the example 1 are coated on these LED chips in a semispherical shape as illustrated in FIG. 1, this is heat treated at the temperature of 140° C. to cure the silicone resin, and thereby, a phosphor layer of which diameter is 6.0 mm, thickness T1 is 3 mm is formed. The light emitting device obtained as stated above is provided for the property evaluation as described below.

Examples 5 to 6

The phosphor layers are each formed as same as the example 4 except that an alumina substrate of which the water absorption rate is 41% (example 5) and an alumina substrate of which the water absorption rate is 58% (example 6) are used. The light emitting devices obtained as stated above is provided for the property evaluation as described below.

Example 7

Six pieces of LED chips are mounted on an alumina substrate of which the water absorption rate is 11%, and thereafter, a silicone resin which does not contain the phosphor is coated. Next, the phosphor slurry prepared at the example 1 is coated as same as the example 4. The heat treatment is performed for this at the temperature of 140° C. to cure the silicone resin, to thereby manufacture a light emitting device having a two-layer structure of the transparent silicone resin layer and the phosphor layer. The thickness T2 of the transparent silicon layer is 3 mm, the thickness T1 of the phosphor layer is 0.5 mm. The light emitting device obtained as stated above is provided for the property evaluation as described below.

Examples 8 to 9

The transparent silicone resin layer and the phosphor layer are each formed as same as the example 7 except that an alumina substrate of which the water absorption rate is 41% (example 8) and an alumina substrate of which the water absorption rate is 58% (example 9) are used. The light emitting devices obtained as stated above are provided for the property evaluation as described below.

Comparative Example 1

The phosphor layer is formed as same as the example 1 except that an alumina substrate of which the water absorption rate is practically 0 (zero) % is used. The light emitting device obtained as stated above is provided for the property evaluation as described below.

Comparative Example 2

The phosphor layer is formed as same as the example 1 except that a nitride aluminum substrate of which water absorption rate is practically 0 (zero) % is used. The light emitting device obtained as stated above is provided for the property evaluation as described below. Note that the wiring pattern is formed by evaporating an Ag thin film, and further, the die pad is formed by evaporating an Au—Sn solder at a surface of the nitride aluminum substrate.

Comparative Example 3

The phosphor layer is formed as same as the example 4 except that an alumina substrate of which water absorption rate is practically 0 (zero) % is used. The light emitting device obtained as stated above is provided for the property evaluation as described below.

Comparative Example 4

The phosphor layer is formed as same as the example 4 except that a nitride aluminum substrate of which water absorption rate is practically 0 (zero) % is used. The light emitting device obtained as stated above is provided for the property evaluation as described below. Note that the wiring pattern is formed by evaporating an Ag thin film, and further, the die pad is formed by evaporating an Au—Sn solder at a surface of the nitride aluminum substrate.

Comparative Example 5

The phosphor layer is formed as same as the example 1 except that an alumina substrate of which water absorption rate is 2% is used. The light emitting device obtained as stated above is provided for the property evaluation as described below.

Current is flowed to light each of the white light emitting devices according to the examples 1 to 9, and the comparative examples 1 to 5, and light emission efficiency, a color temperature, an average color rendering index Ra of each white light emitting device are measured. The current of 20 mA is flowed for a device of which phosphor layer is in the columnar state and the current of 120 mA is flowed for a device of which phosphor layer is in the semispherical state to evaluate them. The adhesion strength of the silicone resin layer (phosphor layer) is measured according to the above-stated method. The adhesion strength of a stacked film between the transparent silicone resin layer and the phosphor layer is measured as for each of the examples 7 to 9. These measurements, evaluation results are represented in Table 1.

TABLE 1

| | SUBSTRATE | | | | LIGHT | | AVERAGE COLOR |
|---|---|---|---|---|---|---|---|
| | MATERIAL | WATER ABSORPTION RATE (%) | RESIN LAYER | SHAPE OF PHOSPHOR LAYER | ADHESION STRENGTH (N) | EMISSION EFFICIENCY (lm/W) | COLOR TEMPERATURE (K) | RENDERING INDEX Ra |
| EXAMPLE 1 | ALUMINA | 5.5 | SILICONE | COLUMNAR BODY | 4.5 | 62 | 4230 | 95.2 |
| EXAMPLE 2 | ALUMINA | 11 | SILICONE | COLUMNAR BODY | 5.3 | 60 | 4228 | 94.6 |
| EXAMPLE 3 | ALUMINA | 52 | SILICONE | COLUMNAR BODY | 8.2 | 61 | 4233 | 93.2 |
| EXAMPLE 4 | ALUMINA | 11 | SILICONE | SEMISPHERICAL STATE | 5.4 | 60 | 4254 | 94.6 |
| EXAMPLE 5 | ALUMINA | 41 | SILICONE | SEMISPHERICAL STATE | 7.5 | 59 | 4230 | 93.7 |
| EXAMPLE 6 | ALUMINA | 58 | SILICONE | SEMISPHERICAL STATE | 8.7 | 61 | 4251 | 93.0 |
| EXAMPLE 7 | ALUMINA | 11 | SILICONE | SEMISPHERICAL STATE (TWO-LAYER STRUCTURE) | 5.3 | 64 | 4230 | 93.1 |
| EXAMPLE 8 | ALUMINA | 41 | SILICONE | SEMISPHERICAL STATE (TWO-LAYER STRUCTURE) | 7.5 | 63 | 4235 | 93.2 |
| EXAMPLE 9 | ALUMINA | 58 | SILICONE | SEMISPHERICAL STATE (TWO-LAYER STRUCTURE) | 8.8 | 64 | 4240 | 93.1 |
| COMPARATIVE EXAMPLE 1 | ALUMINA | 0 | SILICONE | COLUMNAR BODY | 0.4 | 45 | 4261 | 93.4 |
| COMPARATIVE EXAMPLE 2 | AlN | 0 | SILICONE | COLUMNAR BODY | 0.4 | 59 | 4259 | 93.4 |
| COMPARATIVE EXAMPLE 3 | ALUMINA | 0 | SILICONE | SEMISPHERICAL STATE | 0.5 | 40 | 4235 | 93.4 |

TABLE 1-continued

| | SUBSTRATE | | | | LIGHT | | AVERAGE COLOR |
|---|---|---|---|---|---|---|---|
| | MATERIAL | WATER ABSORPTION RATE (%) | RESIN LAYER | SHAPE OF PHOSPHOR LAYER | ADHESION STRENGTH (N) | EMISSION EFFICIENCY (lm/W) | COLOR TEMPERATURE (K) | RENDERING INDEX Ra |
| COMPARATIVE EXAMPLE 4 | AlN | 0 | SILICONE | SEMISPHERICAL STATE | 0.5 | 58 | 4240 | 93.6 |
| COMPARATIVE EXAMPLE 5 | ALUMINA | 2 | SILICONE | SEMISPHERICAL STATE | 0.8 | 55 | 4242 | 93.7 |

As it is obvious from Table 1, the adhesion strength between the substrate and the silicone resin layer is high in each of the white light emitting devices according to the examples 1 to 9 compared to the comparative examples 1 to 5. Further, the light emission efficiency is excellent, and the color temperature and the average color rendering index Ra are also excellent in each of the white light emitting devices according to Examples 1 to 9.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A light emitting device, comprising:
a planar alumina substrate;
a semiconductor light-emitting element mounted on the alumina substrate;
a first silicone resin layer with transparency provided on the alumina substrate to cover an upper surface and a side surface of the semiconductor light-emitting element; and
a phosphor layer including a second silicone resin layer provided on the alumina substrate to cover an outer surface of the first silicone resin layer, and a phosphor, dispersed in the second silicone resin layer, emitting visible light by being excited with light emitted from the semiconductor light-emitting element,
wherein the alumina substrate has a water absorption rate of 5% or more and 60% or less, and each of an adhesion strength between the alumina substrate and the first silicone resin layer and an adhesion strength between the alumina substrate and the second silicone resin layer is 1 N or more,
wherein the first silicone resin layer does not contain the phosphor, and is configured to inhibit absorption of the light emitted from the semiconductor light-emitting element, and
wherein an external surface of the phosphor layer has a semispherical shape, a columnar shape, or an oval cylindrical shape so that the visible light is emitted from a whole external surface of the phosphor layer to an outside of the light emitting device.

2. The light emitting device according to claim 1, wherein the semiconductor light-emitting element emits the light of which peak wavelength is in a range of 360 nm or more and 440 nm or less.

3. The light emitting device according to claim 2, wherein the phosphor layer includes a blue phosphor, a green phosphor and a red phosphor, and emits white light by being excited with the light emitted from the semiconductor light-emitting element.

4. The light emitting device according to claim 1, wherein the semiconductor light-emitting element emits the light of which peak wavelength is in a range of 360 nm or more and 410 nm or less.

5. The light emitting device according to claim 1, wherein the semiconductor light-emitting element is a light-emitting diode or a laser diode.

6. The light emitting device according to claim 1, wherein a thickness of the phosphor layer on the upper surface of the semiconductor light-emitting element is in a range of 0.1 mm or more and 2 mm or less.

7. The light emitting device according to claim 1, wherein plural semiconductor light-emitting elements are mounted on the alumina substrate.

8. The light emitting device according to claim 1, wherein a thickness of the first silicone resin layer on the upper surface of the semiconductor light-emitting element is in a range of 0.5 mm or more and 5 mm or less.

9. The light emitting device according to claim 1, wherein the external surface of the phosphor layer has the semispherical shape.

10. The light emitting device according to claim 1, wherein the whole external surface of the phosphor layer except a contact surface with the alumina substrate is exposed toward the outside of the light emitting device.

* * * * *